(12) United States Patent
Lin et al.

(10) Patent No.: US 10,139,690 B2
(45) Date of Patent: Nov. 27, 2018

(54) ARRAY SUBSTRATE AND MANUFACTURE METHOD THEREOF, LIQUID CRYSTAL DISPLAY PANEL

(71) Applicant: Shenzhen China Star Optoelectronics Technology Co., Ltd., Shenzhen, Guangdong (CN)

(72) Inventors: Bifen Lin, Guangdong (CN); Qiming Gan, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 200 days.

(21) Appl. No.: 15/125,193

(22) PCT Filed: Jul. 20, 2016

(86) PCT No.: PCT/CN2016/090609
§ 371 (c)(1),
(2) Date: Sep. 12, 2016

(87) PCT Pub. No.: WO2018/000481
PCT Pub. Date: Jan. 4, 2018

(65) Prior Publication Data
US 2018/0217457 A1 Aug. 2, 2018

(30) Foreign Application Priority Data
Jun. 29, 2016 (CN) .......................... 2016 1 0493244

(51) Int. Cl.
*H01L 29/10* (2006.01)
*H01L 29/04* (2006.01)
(Continued)

(52) U.S. Cl.
CPC ...... *G02F 1/136204* (2013.01); *G02F 1/1368* (2013.01); *G02F 1/13439* (2013.01);
(Continued)

(58) Field of Classification Search
CPC ............... H01L 27/1288; H01L 27/124; G02F 2201/123; G02F 2201/121; G02F 1/1368;
(Continued)

(56) References Cited

U.S. PATENT DOCUMENTS

2013/0300968 A1* 11/2013 Okajima ........... G02F 1/136209
349/43
2014/0225106 A1* 8/2014 Lee ................... H01L 21/02554
257/43
(Continued)

FOREIGN PATENT DOCUMENTS

CN  102403311 A  4/2012
CN  102566168 A  7/2012
(Continued)

*Primary Examiner* — Brian Turner
(74) *Attorney, Agent, or Firm* — Andrew C. Cheng

(57) ABSTRACT

The disclosure provides an array substrate, including a substrate, a common line, a separation layer, a gate line layer, a first insulation layer, a data line layer, a second insulation layer, a first transparent electrode, a third insulation layer and a second transparent electrode overlapped in sequence, a first via hole is defined in the separation layer, a second via hole is defined in the first insulation layer, a third via hole and a fourth via hole communicated with the second via hole are defined in the second insulation layer, the first transparent electrode penetrates the first via hole, the second via hole and the fourth via hole to connect with the common line, a fifth via hole communicated with the third via hole is defined in the third insulation layer, the second transparent electrode is connected to the data line layer.

11 Claims, 1 Drawing Sheet

(51) Int. Cl.
| | |
|---|---|
| *H01L 31/105* | (2006.01) |
| *H01L 27/12* | (2006.01) |
| *G02F 1/1345* | (2006.01) |
| *G02F 1/1362* | (2006.01) |
| *G02F 1/1343* | (2006.01) |
| *G02F 1/1333* | (2006.01) |
| *G02F 1/1368* | (2006.01) |
| *H01L 21/311* | (2006.01) |
| *H01L 29/786* | (2006.01) |
| *H01L 29/66* | (2006.01) |
| *H01L 21/02* | (2006.01) |
| *H01L 21/306* | (2006.01) |
| *H01L 21/768* | (2006.01) |

(52) U.S. Cl.
CPC .. *G02F 1/133345* (2013.01); *G02F 1/136227* (2013.01); *G02F 1/136286* (2013.01); *H01L 27/1222* (2013.01); *H01L 27/1244* (2013.01); *H01L 27/1248* (2013.01); *H01L 27/1262* (2013.01); *G02F 2001/13629* (2013.01); *G02F 2001/13685* (2013.01); *G02F 2001/136295* (2013.01); *G02F 2202/104* (2013.01); *H01L 21/02422* (2013.01); *H01L 21/02532* (2013.01); *H01L 21/02592* (2013.01); *H01L 21/02669* (2013.01); *H01L 21/30604* (2013.01); *H01L 21/31111* (2013.01); *H01L 21/76802* (2013.01); *H01L 27/1274* (2013.01); *H01L 29/66757* (2013.01); *H01L 29/78675* (2013.01)

(58) Field of Classification Search
CPC ............ G02F 1/136286; G02F 1/13439; G02F 1/133345
See application file for complete search history.

(56) References Cited

U.S. PATENT DOCUMENTS

| | | | |
|---|---|---|---|
| 2015/0037943 | A1 | 2/2015 | Park et al. |
| 2015/0311232 | A1* | 10/2015 | Sun ................... G02F 1/136227 257/72 |

FOREIGN PATENT DOCUMENTS

| | | |
|---|---|---|
| CN | 102569187 A | 7/2012 |
| CN | 102790012 A | 11/2012 |
| CN | 103258827 A | 8/2013 |
| CN | 105405851 A | 3/2016 |

* cited by examiner

ARRAY SUBSTRATE AND MANUFACTURE METHOD THEREOF, LIQUID CRYSTAL DISPLAY PANEL

CROSS REFERENCE

This disclosure claims priority to Chinese patent application No. 201610493244.7, entitled "ARRAY SUBSTRATE AND MANUFACTURE METHOD THEREOF, LIQUID CRYSTAL DISPLAY PANEL" filed on Jun. 29, 2016, which is incorporated by reference in its entirety.

FIELD OF THE DISCLOSURE

The disclosure relates to a display technical field, and more particularly to an array substrate and a manufacture method thereof, a liquid crystal display panel.

BACKGROUND OF THE DISCLOSURE

A low temperature poly-silicon liquid crystal display (LTPS-LCD) dominates the flat panel display market due to advantages such as high resolution, instant response, intense brightness and high aperture ratio.

A liquid crystal display panel commonly includes an array substrate and a color film substrate, the array substrate and the color film substrate are aligned to form a liquid crystal panel. In general, a gate line or a scanning line, a data line and a common line are disposed on the array substrate. The gate line and the common line are paved by a same layer of metal, the gate line and the common line are formed by a process such as etching, but as the two are adjacent, a short circuit can be caused easily with a result of connection errors.

SUMMARY OF THE DISCLOSURE

An objective of the disclosure is to provide an array substrate and a manufacture method thereof, which can solve connection errors of the gate line layer and the common line, so as to improve stability of a liquid crystal display panel.

Another objective of the disclosure is to provide a liquid crystal display panel adopting the array substrate mentioned above.

To achieve the previous objectives, the embodiments of the disclosure are as follows.

The disclosure provides an array substrate, including a substrate, a common line, a separation layer, a gate line layer, a first insulation layer, a data line layer, a second insulation layer, a first transparent electrode, a third insulation layer and a second transparent electrode overlapped in sequence, a first via hole is defined in the separation layer, a second via hole is defined in the first insulation layer, a third via hole and a fourth via hole communicated with the second via hole are defined in the second insulation layer, the first transparent electrode penetrates the first via hole, the second via hole and the fourth via hole to connect with the common line, a fifth via hole communicated with the third via hole is defined in the third insulation layer, the second transparent electrode penetrates the fifth via hole and the third via hole to connect with the data line layer.

The separation layer includes a buffer layer, a poly-silicon layer and a gate insulation layer overlapped in sequence, the buffer layer covers the common line.

A sixth via hole is defined in the first insulation layer, a seventh via hole communicated with the sixth via hole is defined in the gate insulation layer. The data line layer penetrates the sixth via hole and the seventh via hole to connect with the poly-silicon layer.

The buffer layer includes SiNx or $SiO_2$ or a composite material of SiNx and $SiO_2$.

The gate line layer includes a conductive block, the conductive block penetrates the first via hole to connect with the common line. The first transparent electrode penetrates the second via hole and the fourth via hole to connect with the conductive block.

The disclosure provides a liquid crystal display panel, including a substrate, a common line, a separation layer, a gate line layer, a first insulation layer, a data line layer, a second insulation layer, a first transparent electrode, a third insulation layer and a second transparent electrode overlapped in sequence, a first via hole is defined in the separation layer, a second via hole is defined in the first insulation layer, a third via hole and a fourth via hole communicated with the second via hole are defined in the second insulation layer, the first transparent electrode penetrates the first via hole, the second via hole and the fourth via hole to connect with the common line, a fifth via hole communicated with the third via hole is defined in the third insulation layer, the second transparent electrode penetrates the fifth via hole and the third via hole to connect with the data line layer.

The separation layer includes a buffer layer, a poly-silicon layer and a gate insulation layer overlapped in sequence, the buffer layer covers the common line.

A sixth via hole is defined in the first insulation layer, a seventh via hole communicated with the sixth via hole is defined in the gate insulation layer. The data line layer penetrates the sixth via hole and the seventh via hole to connect with the poly-silicon layer.

The buffer layer includes SiNx or $SiO_2$ or a composite material of SiNx and $SiO_2$.

The gate line layer includes a conductive block, the conductive block penetrates the first via hole to connect with the common line. The first transparent electrode penetrates the second via hole and the fourth via hole to connect with the conductive block.

The disclosure provides a manufacture method of an array substrate, including forming a common line on the substrate, forming a separation layer that covers the common line on the substrate, forming a first via hole in the separation layer, forming a gate line layer on the separation layer, forming a first insulation layer on the gate line layer, forming a data line layer on the first insulation layer, forming a second insulation layer on the data line layer, forming a first long via hole communicated with the first via hole in the second insulation layer, forming a first transparent electrode on the second insulation layer, the first transparent electrode penetrates the first via hole and the first long via hole to connect with the common line, forming a third insulation layer on the first transparent electrode, forming a second long via hole communicated with the data line layer in the third insulation layer, forming a second transparent electrode on the third insulation layer, the second transparent electrode penetrates the second long via hole to connect with the data line layer.

A step of forming the gate line layer on the separation layer includes forming a conductive block connected with the common line through the first via hole on the gate line layer.

A step of forming the separation layer that covers the common line on the substrate includes forming a buffer layer, a poly-silicon layer and a gate insulation layer in sequence, the buffer layer covers the common line.

A step of forming the first insulation layer on the gate line layer includes forming a third long via hole communicated with the poly-silicon layer in the first insulation layer.

The embodiments of the disclosure have following advantages or beneficial effects. The gate line layer and the common line are disposed in different conductive layers according to the disclosure, the gate line layer and the common line are separated by the separation layer to prevent a short circuit caused by a short distance between the two that results in connection errors, stability of the array substrate and the liquid crystal display panel can be improved. The disclosure further provides a manufacture method of the array substrate mentioned above.

BRIEF DESCRIPTION OF THE DRAWINGS

In order to more clearly illustrate embodiments of the disclosure or prior art, following figures described in embodiments or prior art will be briefly introduced, it is obvious that the drawings are merely some embodiments of the disclosure, a person skilled in the art can obtain other figures according to these figures without creativity.

DETAILED DESCRIPTION OF PREFERRED EMBODIMENTS

Embodiments of the disclosure are described in detail with reference to the accompanying drawings as follows, obviously, the described embodiments are part of embodiments of the disclosure rather than all of them. Based on the embodiments of the disclosure, all other embodiments obtained by a person skilled in the art without creativity should be considered within the scope of protection of the disclosure.

Moreover, in description of the disclosure, unless otherwise mentioned, the meaning of "a plurality of" is two or more. If the term "a process" appears in the disclosure, it indicates more than an independent process, when it can hardly be distinguished from other processes, expected functions that can assist the process are included in the term as well. Moreover, a numerical range represented by "~" in the disclosure indicates a range limited by numbers at two ends of "~" as the minimum value and the maximum value. In figures, similar or same structures are labelled by a same number.

Figure 1:
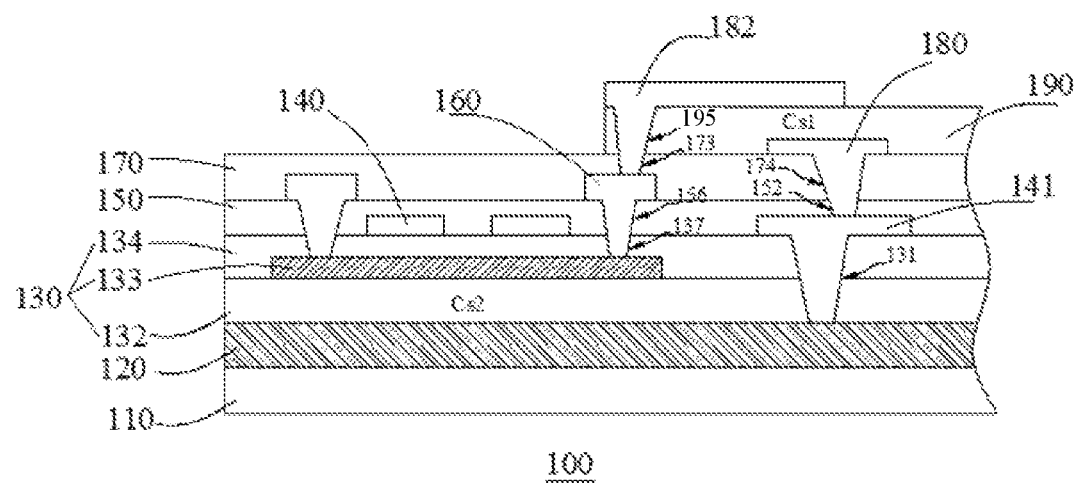
FIG. 1 is a schematic structural view of a cross section of an array substrate of the disclosure.

Referring to FIG. 1, the disclosure provides an array substrate 100, including a substrate 110, a common line 120, a separation layer 130, a gate line layer (not labelled in the figure), a first insulation layer 150, a data line layer (not labelled in the figure), a second insulation layer 170, a first transparent electrode 180, a third insulation layer 190 and a second transparent electrode 182. The common line 120 is disposed on the substrate 110. The separation layer 130 is disposed above the substrate 110 and covering the common line 120, a first via hole 131 is defined in the separation layer 130. The gate line layer is disposed on the separation layer 130, the gate line layer includes a plurality of gate lines 140 disposed separately. The first insulation layer 150 covers the gate line layer, a second via hole 152 is defined in the first insulation layer 150. The data line layer is disposed on the first insulation layer 150, the data line layer includes a plurality of data lines 160 disposed separately. The second insulation layer 170 covers the data line layer, a third via hole 173 and a fourth via hole 174 communicated with the second via hole 152 are defined in the second insulation layer 170. The first transparent electrode 180 is disposed on the second insulation layer 170, the first transparent electrode 180 penetrates the first via hole 131, the second via hole 152 and the fourth via hole 174 to connect with the common line 120. The third insulation layer 190 is disposed on the first transparent electrode 180, a fifth via hole 195 communicated with the third via hole 173 is defined in the third insulation layer 190. The second transparent electrode 182 is disposed on the third insulation layer 190, the second transparent electrode 182 penetrates the fifth via hole 195 and the third via hole 173 to connect with the data lines 140 on the data line layer.

The gate line layer and the common line are disposed in different conductive layers according to the disclosure, the gate line layer and the common line are separated by the separation layer to prevent a short circuit caused by a short distance between the two that results in connection errors, stability of the liquid crystal display panel can be improved.

Specifically, the separation layer 130 includes a buffer layer 132, a poly-silicon layer 133 and a gate insulation layer 134 overlapped in sequence, the buffer layer 132 covers the common line 120, the poly-silicon layer 133 is between the buffer layer 132 and the gate insulation layer 134.

Furthermore, a sixth via hole 156 is defined in the first insulation layer 150, a seventh via hole 137 communicated with the sixth via hole 156 is defined in the gate insulation layer, the data line layer 160 penetrates the sixth via hole 156 and the seventh via hole 137 to connect with the poly-silicon layer 133. It is comprehensible that the sixth via hole 156 and the seventh via hole 137 can be obtained in an etching process (a third long via hole as follows). Identically, the fifth via hole 195 and the third via hole 173 can be obtained in one process as well (a second long via hole as follows).

Figure 2:
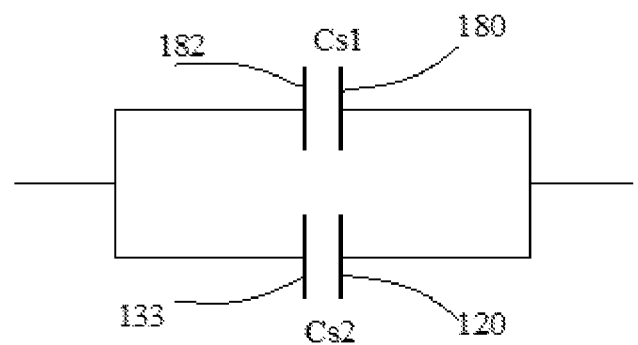
FIG. 2 is a schematic structural view of a capacitor with the array substrate in FIG. 1.

Referring to FIG. 2 as well, a first storage capacitor Cs1 is formed between the first transparent electrode 180 and the second transparent electrode 182 in the disclosure. A second storage capacitor Cs2 is formed between the poly-silicon layer 133 and the common line 120. The poly-silicon layer 133 is a substrate of the second storage capacitor Cs2, the buffer layer 132 is an insulation layer of the storage capacitor Cs2, the common line 120 is another substrate. Which is equally to parallel connect an equivalent storage capacitor based on the original (the first storage capacitor Cs1). Capacity of the storage capacitor is increased without changing the pixel aperture ratio.

Preferably, material of the third insulation layer 190 and that of the buffer layer 132 are SiNx, SiO$_2$ or a composite material of SiNx and SiO$_2$.

Preferably, the gate line layer further includes a conductive block 141. The conductive block 141 is a metallic conductive block. The conductive block 141 penetrates the first via hole 131 to connect with the common line 120, the first transparent electrode 180 penetrates the second via hole 152 and the fourth via hole 174 to connect with the conductive block 141. It is comprehensible that the second via hole 152 and the fourth via hole 174 can be formed in one etching process simultaneously.

A purpose of connecting the first transparent electrode 180 and the common line 120 by the first metallic block 141 is to prevent a via hole (a first long via hole as follows) formed by the second via hole 152 and the fourth via hole 174 to be over deep, resulting in a chasm appears during the connection of the first transparent electrode 180 and the common line 120.

Furthermore, to chase an excellent shading effect, the common line 120 can be made with material that can shade light and conduct electricity such as molybdenum aluminum alloy, metal chromium or molybdenum.

Preferably, a thickness of the separation layer is 0.2 mm-0.35 mm.

According to the array substrate 100 above, the disclosure further provides a liquid crystal display panel adopting the array substrate 100 above.

The disclosure further provides a manufacture method of the array substrate above. It primarily includes following steps.

S001, forming a common line on the substrate.

Specifically, the substrate is a glass substrate, the common line is formed by filming, photoetching and etching processes.

S002, forming a separation layer that covers the common line on the substrate.

Specifically, it includes forming a buffer layer and a poly-silicon layer in sequence on the common line by the filming process, the buffer layer includes SiNx or $SiO_2$ or a composite material of SiNx and $SiO_2$, a thickness of the buffer layer and an order of the poly-silicon layer are not restricted. Then a crystallization process of amorphous silicon is undertaken, subsequently an active layer pattern is manufactured by the photoetching and etching processes, and covering a gate insulation layer.

S003, forming a first via hole in the separation layer.

Specifically, the first via hole is etched in the gate insulation layer, the buffer layer below and the poly-silicon layer by a dry etching process.

S004, forming a gate line layer on the separation layer.

Specifically, a gate line layer is produced by the filming and photoetching processes, the formed gate line layer includes a gate line and a conductor block to connect the common line and the conductive block through the first via hole, the purpose of which is to prevent the via hole to be over deep, resulting in a chasm appears during the communication of the first transparent electrode above and the common line.

S005, forming a first insulation layer on the gate line layer.

Specifically, it includes forming a third long via hole communicated with the poly-silicon layer in the first insulation layer by the filming and photoetching processes.

S006, forming a data line layer on the first insulation layer.

Specifically, the data line layer is produced on the first insulation layer by the filming process.

S007, forming a second insulation layer on the data line layer.

S008, forming a first long via hole communicated with the first via hole in the second insulation layer.

Specifically, the first long via hole penetrates the first insulation layer and the second insulation layer.

S009, forming a first transparent electrode on the second insulation layer, the first transparent electrode penetrates the first via hole and the first long via hole to connect with the common line.

S010, forming a third insulation layer on the first transparent electrode.

S011, forming a second long via hole communicated with the data line layer in the third insulation layer.

Specifically, the third insulation layer is fabricated by the filming and photoetching processes, the second long via hole is etched in the third insulation layer, the second long via hole penetrates the third insulation layer and the second insulation layer to communicate with the data line layer.

S012, forming a second transparent electrode on the third insulation layer, the second transparent electrode penetrates the second long via hole to connect with the data line layer.

In description of the disclosure, reference terms "an embodiment", "embodiments", "example", "specific example" or "examples" indicate specific features, structures, materials or characteristics to be included in at least one embodiment or example of the disclosure. In the disclosure, the terms above are unnecessary to be regarded as the same embodiment or example. Moreover, described features, structures, materials or characteristics can be combined in any one or more of embodiments or examples in a proper manner.

Above are embodiments of the disclosure, which do not limit the scope of the disclosure, any modifications, equivalent replacements or improvements within the spirit and principles of the embodiments described above should be covered by the protected scope of the disclosure.

What is claimed is:

1. An array substrate, comprising: a substrate, a common line, a separation layer, a gate line layer, a first insulation layer, a data line layer, a second insulation layer, a first transparent electrode, a third insulation layer and a second transparent electrode overlapped in sequence, wherein a first via hole is defined in the separation layer, a second via hole is defined in the first insulation layer, a third via hole and a fourth via hole are defined in the second insulation layer, the fourth via hole is communicated with the second via hole, the first transparent electrode is connected, through the first via hole, the second via hole and the fourth via hole, to the common line, a fifth via hole communicated with the third via hole is defined in the third insulation layer, the second transparent electrode penetrates the fifth via hole and the third via hole to connect with the data line layer; and wherein the gate line layer comprises a conductive block, which penetrates the first via hole to connect with the common line, and the first transparent electrode penetrates the second via hole and the fourth via hole to connect with the conductive block.

2. The array substrate according to claim 1, wherein the separation layer comprises a buffer layer, a poly-silicon layer and a gate insulation layer overlapped in sequence, the buffer layer covers the common line.

3. The array substrate according to claim 2, wherein a sixth via hole is defined in the first insulation layer, a seventh via hole communicated with the sixth via hole is defined in the gate insulation layer, the data line layer penetrates the sixth via hole and the seventh via hole to connect with the poly-silicon layer.

4. The array substrate according to claim 2, wherein the buffer layer comprises SiNx or $SiO_2$ or a composite material of SiNx and $SiO_2$.

5. A liquid crystal display panel, comprising an array substrate, which comprises: a substrate, a common line, a separation layer, a gate line layer, a first insulation layer, a data line layer, a second insulation layer, a first transparent electrode, a third insulation layer and a second transparent electrode overlapped in sequence, wherein a first via hole is defined in the separation layer, a second via hole is defined in the first insulation layer, a third via hole and a fourth via hole are defined in the second insulation layer, the fourth via hole is communicated with the second via hole, the first transparent electrode is connected, through the first via hole, the second via hole and the fourth via hole, to the common line, a fifth via hole communicated with the third via hole is defined in the third insulation layer, the second transparent electrode penetrates the fifth via hole and the third via hole to connect with the data line layer; and wherein the gate line layer comprises a conductive block that penetrates the first via hole to connect with the common line, and the first transparent electrode penetrates the second via hole and the fourth via hole to connect with the conductive block.

6. The liquid crystal display panel according to claim 5, wherein the separation layer comprises a buffer layer, a poly-silicon layer and a gate insulation layer overlapped in sequence, the buffer layer covers the common line.

7. The liquid crystal display panel according to claim 6, wherein a sixth via hole is defined in the first insulation layer, a seventh via hole communicated with the sixth via hole is defined in the gate insulation layer, the data line layer penetrates the sixth via hole and the seventh via hole to connect with the poly-silicon layer.

8. The liquid crystal display panel according to claim 6, wherein the buffer layer comprises $SiN_x$ or $SiO_2$ or a composite material of $SiN_x$ and $SiO_2$.

9. A manufacture method of an array substrate, comprising the following steps: forming a common line on the substrate; forming a separation layer that covers the common line on the substrate; forming a first via hole in the separation layer; forming a gate line layer on the separation layer; forming a first insulation layer on the gate line layer; forming a data line layer on the first insulation layer; forming a second insulation layer on the data line layer; forming a first long via hole communicated with the first via hole in the second insulation layer; forming a first transparent electrode on the second insulation layer, the first transparent electrode penetrates the first long via hole to connect, through the first via hole, to the common line; forming a third insulation layer on the first transparent electrode; forming a second long via hole communicated with the data line layer in the third insulation layer; forming a second transparent electrode on the third insulation layer, the second transparent electrode penetrates the second long via hole to connect with the data line layer; and wherein the step of forming a gate line layer on the separation layer comprises forming a conductive block that penetrates the first via to connect with the common line, such that the first transparent electrode that penetrates the first long via hole is connected to the conductive block that penetrates the first via hole to connect with the common line.

10. The manufacture method of an array substrate according to claim 9, wherein the step of forming a separation layer that covers the common line on the substrate comprises: forming a buffer layer, a poly-silicon layer and a gate insulation layer in sequence, wherein the buffer layer covers the common line.

11. The manufacture method of an array substrate according to claim 10, wherein the step of forming a first insulation layer on the gate line layer comprises forming a third long via hole communicated with the poly-silicon layer in the first insulation layer.

\* \* \* \* \*